US006781217B2

(12) United States Patent
Chow

(10) Patent No.: US 6,781,217 B2
(45) Date of Patent: Aug. 24, 2004

(54) TRANSMISSION LINE STRUCTURE AND METHOD OF SIGNAL PROPAGATION

(75) Inventor: David GenLong Chow, Los Altos, CA (US)

(73) Assignee: Intel Corporation, Santa Clara, CA (US)

(*) Notice: Subject to any disclaimer, the term of this patent is extended or adjusted under 35 U.S.C. 154(b) by 40 days.

(21) Appl. No.: 10/029,353

(22) Filed: Dec. 21, 2001

(65) Prior Publication Data

US 2003/0119310 A1 Jun. 26, 2003

(51) Int. Cl.[7] ............................ H01L 39/00; H01Q 3/24

(52) U.S. Cl. ....................... 257/662; 257/664; 343/876; 343/884; 343/905; 333/32; 333/172

(58) Field of Search ................................ 257/662, 664; 343/876, 884, 905, 911 L, 911 R, 700 MS; 333/32, 172, 164, 17.3, 124, 128; 438/624, 738; 372/43

(56) References Cited

U.S. PATENT DOCUMENTS

| | | | | |
|---|---|---|---|---|
| 5,827,776 | A | * 10/1998 | Bandyopadhyay et al. | 438/624 |
| 6,479,399 | B2 | * 11/2002 | Park et al. | 438/738 |
| 2002/0008251 | A1 | * 1/2002 | Galli | 257/200 |
| 2002/0181523 | A1 | * 12/2002 | Pinneo et al. | 372/43 |
| 2003/0099321 | A1 | * 5/2003 | Juan et al. | 375/376 |

* cited by examiner

*Primary Examiner*—Nathan J. Flynn
*Assistant Examiner*—Tan Tran
(74) *Attorney, Agent, or Firm*—Marger Johnson & McCollom

(57) ABSTRACT

A transmission line structure comprises a plurality of conductive lines over an insulating layer. With three conductive lines, a center conductive line is disposed between the outer conductive lines to define a gap distance therebetween that is less than their height. In a further aspect, a conductive layer (e.g., a ground plane) contacts the insulating layer on a side thereof opposite the plurality of conductive lines. A ratio for the height of the conductive lines relative to the distance therebetween is kept greater than another ratio for the width of the center conductor relative to the thickness of the insulating layer.

26 Claims, 4 Drawing Sheets

TRANSMISSION LINE STRUCTURE AND METHOD OF SIGNAL PROPAGATION

BACKGROUND OF THE INVENTION

For transmission line structures, propagation delay corresponds to the amount of time required for a signal to propagate its length. Manufactures of computers, integrated circuits, memories and other electrical circuits continually strive to reduce propagation delays in order to improve system operating speeds.

In the past, manufactures have been working to reduce circuit geometries, which has had the effect of improving operating speeds by way of reduced line lengths. More recently, however, manufactures are looking for additional means to improve operating speed. Such measures have included, e.g., lowering the resistance of conductive lines to reduce their RC delays.

In short, there have been continued efforts to provide computers, CPU's, semiconductor memories, integrated circuits, circuit boards, buses and other electrical devices structures and circuits to propagate signals quickly.

BRIEF SUMMARY OF THE INVENTION

The present disclosure may be best understood with reference to the accompanying drawings, wherein.

DETAILED DESCRIPTION OF THE EMBODIMENTS

Figure 1:
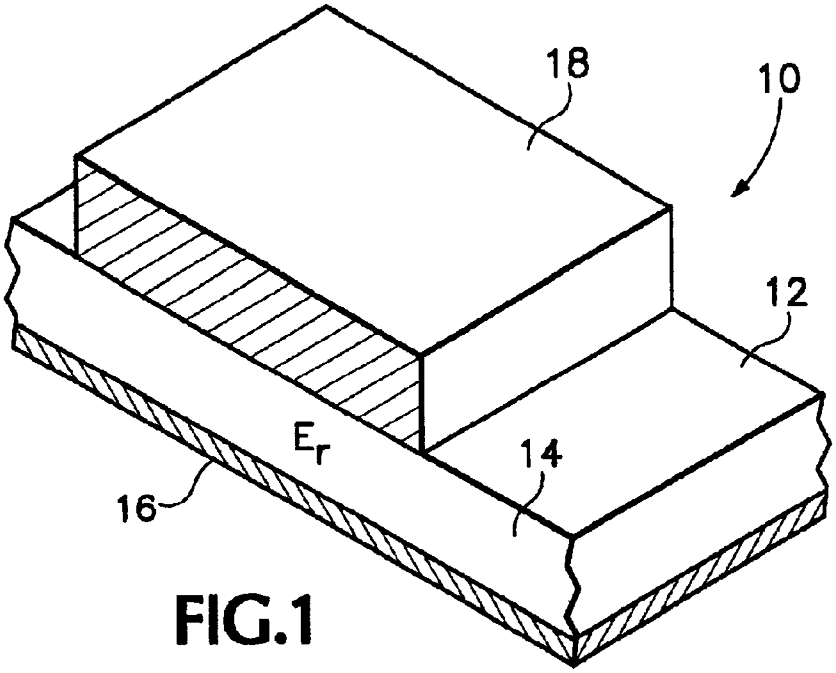
FIG. 1 is a simplified cross sectional isometric view of an exemplary known transmission line structure.

In the following description, numerous specific details are set forth to provide an understanding of the present invention. However, it will be understood that the present invention may be practiced without each of such specific details. In other instances, well-known circuits are shown in block diagram form in order to prevent obscuring the present invention with unnecessary detail. For the most part, detailed particulars concerning timing considerations and the like are omitted inasmuch as such details are not necessary to obtain a complete understanding of the present invention and are within the ability of persons of ordinary skill in the relevant art.

In the drawings, elements are not necessarily drawn to scale. Additionally, like or similar elements are typically designated by the same number through the separate views.

Referencing FIG. 1, an exemplary known transmission line structure for an integrated circuit comprises microstrip 10. Such microstrip comprises conductor 18 disposed over a surface of dielectric 14 opposite conductive layer 16. Such exemplary transmission lines might also include dielectric—e.g., Spin On Glass, BPSG, nitride, polyimide (not shown)—over conductor 18 and substrate 12.

Further referencing FIG. 1, different qualities characterize transmission line 10. Its characteristic impedance may be determined in known manner based upon the width of conductor 18, in addition to its thickness, distance from conductive layer 16 (e.g., ground plane) and the relative dielectric constant $\in_r$ of dielectric 14. Another quality is its propagation delay, the time T required for a signal to propagate along its length l. The propagation delay of transmission line 10 is affected by its phase velocity $v_p$, which is modeled by the following equation.

$$T = \frac{1}{v_p} \qquad \text{Equation 1}$$

For an inhomogeneous transmission line, i.e., of non-uniform dielectric environment, the phase velocity is defined as being related to the velocity of light c divided by the effective dielectric constant $\in_{eff}$ of the line, as shown by the equation below.

$$Vp = \frac{c}{\sqrt{E_{eff}}} \qquad \text{Equation 2}$$

The effective dielectric constant $E_{eff}$, in turn, is related to the capacitance C of the line divided by its linear capacitance $C_o$:

$$E_{eff} = \frac{C}{C_o} \qquad \text{Equation 3}$$

in which the linear capacitance $C_o$ represents the line capacitance with the dielectric 14 replaced with air.

It has been found, in accordance with an exemplary embodiment of the present invention, that propagation delays of integrated circuits may be improved with new transmission line circuits.

Figure 2:
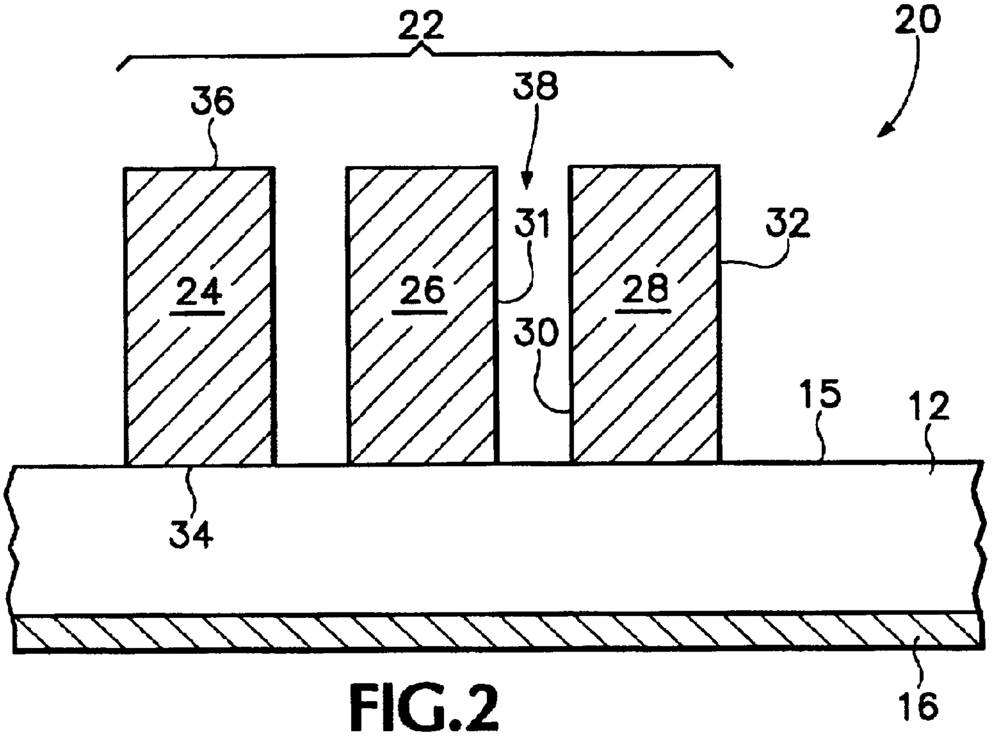
FIG. 2 is a cross sectional view representative of the transmission line structure in accordance with an exemplary embodiment of the present invention.
Figure 3:
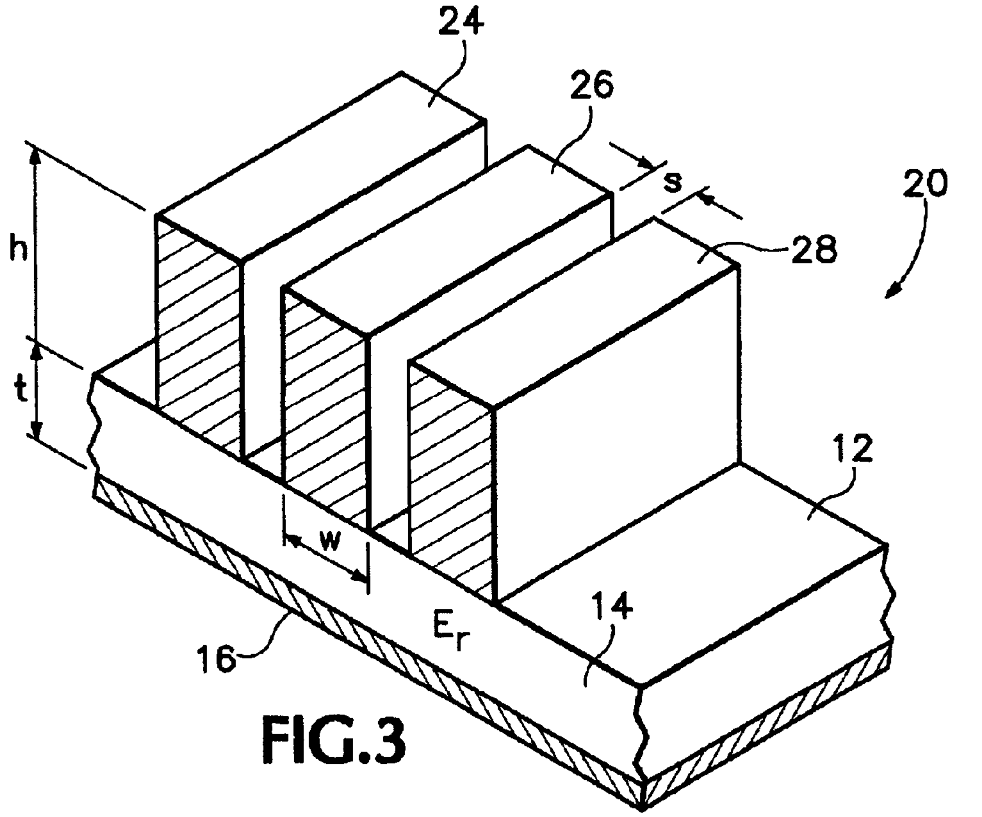
FIG. 3 is a partial cross sectional isometric view of the transmission line structure in accordance with an exemplary embodiment of the present invention.

With reference to FIGS. 2–3, in accordance with an exemplary embodiment of the present invention, conductive lines 22 over surface 15 of dielectric 14 define structure 20 for propagating a signal across substrate 12. In the illustrated example, three conductive lines 24,26,28 may be patterned across surface 15 of substrate 12. The height h of the conductive lines may be established by the distance of their top wall 36 relative to their bottom wall (or edge) 34 over dielectric 15. Side walls 30,31 of adjacent conductive lines face one another to define gap 38. In this embodiment, two outer conductive lines 24,28 sandwich a center conductive line 26 and define a gap spacing therebetween. The gap spacing may be less than the height h of the conductive lines. In alternative embodiments, the conductive lines may be formed to define the gap with a distance less than two-thirds the height of the conductive lines—i.e., $S \leqq 2h/3$. Relative to the cross-section of FIG. 2, this corresponds to a gap aspect ratio greater than 1.5:1.

In some embodiments, the height h of the conductive lines may be designed to be greater than the gap distance s. It has been found that by keeping the height h of the conductive lines greater than the gap distance S, that advantages are observed in a speed of signal propagation along transmission line structure 20.

In accordance with an alternative exemplary embodiment of the present invention, the intercoupling capacitance from the center line 26 to the outer lines 24,28 may be kept greater then the capacitance of the center line 26 to conductive layer (e.g., ground plane) 16 through dielectric 14.

Figure 4:
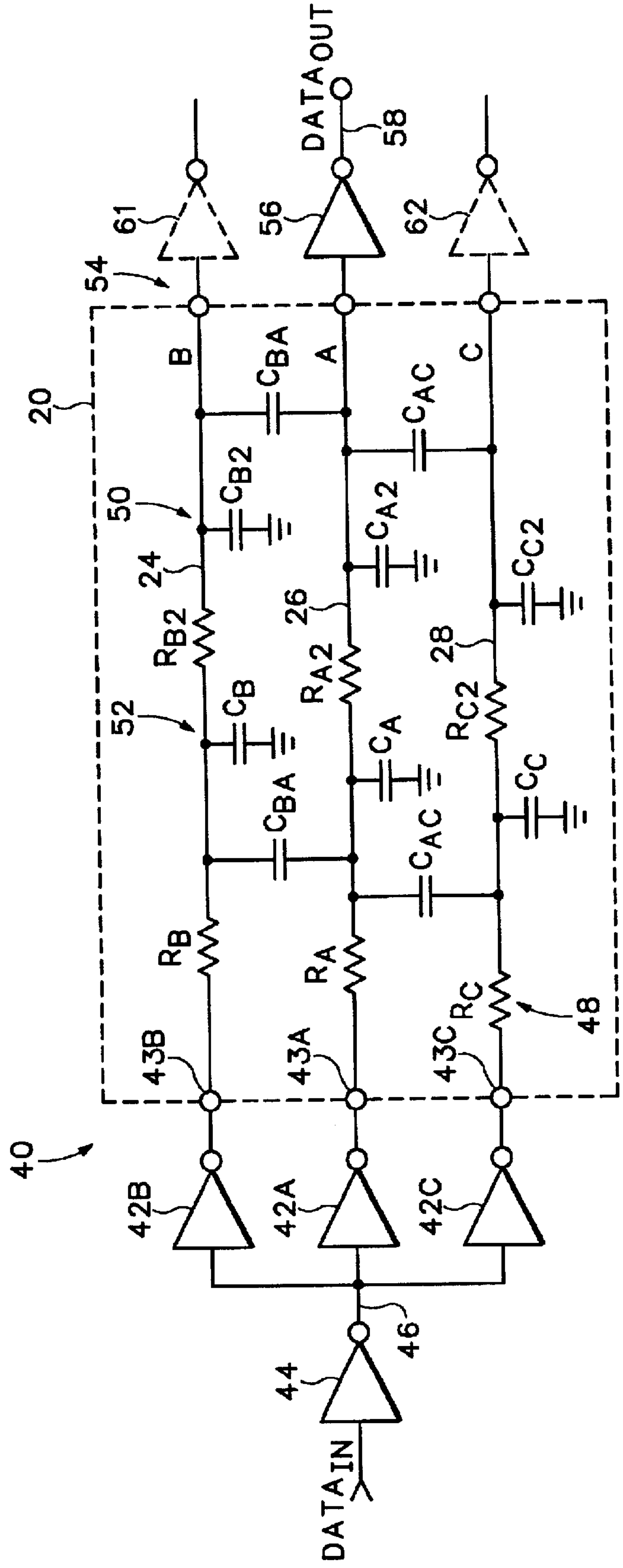
FIG. 4 is a cross sectional view of the transmission line structure in accordance with another exemplary embodiment of the present invention, in which dielectric is formed over and between the lines.

Referencing FIG. 4, each of transmission lines 24,26,28 comprises a capacitance (i.e., per unit length) to ground of $C_B$,$C_A$,$C_C$ respectively, where $C_A$ represents the capacitance of the center conductive line 26 to ground. Additionally, the center conductive line 26 comprises cross capacitances $C_{AB}$ and $C_{AC}$ to the adjacent outer conductive lines 24,28 respectively. A resistance per unit length $R_B$, $R_A$, $R_C$ of the conductive lines may be established based upon their material composition.

In accordance with an exemplary embodiment of the present invention, the ratio of the capacitances $C_{AB}$ and $C_{AC}$ to the adjacent lines may be kept at least equal to the capacitance $C_A$ of the center line to ground.

In accordance with a particular exemplary embodiment of the present invention, the transmission line structure may be formed over an integrated circuit comprising a layer of silicon oxide dielectric. From the above relationships, ignoring fringing fields, the capacitance (per unit length) $C_A$ can be expressed as equal to the width W of the line multiplied by the dielectric constant $\in_r \in_o$, divided by the thickness t of the dielectric.

$$C_A = \frac{E_r E_o W}{t} \quad \text{Equation 4}$$

For the capacitance couplings to the adjacent conductive lines, the capacitances (per unit length) $C_{AB}$, $C_{AC}$ are expressed as being equal to their height h multiplied by the free space permittivity (i.e., $\in_o$) divided by the gap spacing s.

$$C_{AB} = \frac{E_o h}{s} \quad \text{Equation 5}$$

In accordance with this particular exemplary embodiment, the capacitances $C_{AB}$+$C_{AC}$ to the adjacent lines may be kept at least as large as the line's capacitance $C_A$ to ground. Accordingly, the relationship $$\frac{E_o h}{s} \geq \frac{E_r E_o W}{2t} \quad \text{Equation 6}$$

leading to $$\frac{h}{s} \geq \frac{E_r W}{2t} \quad \text{Equation 7}$$

Figure 5:
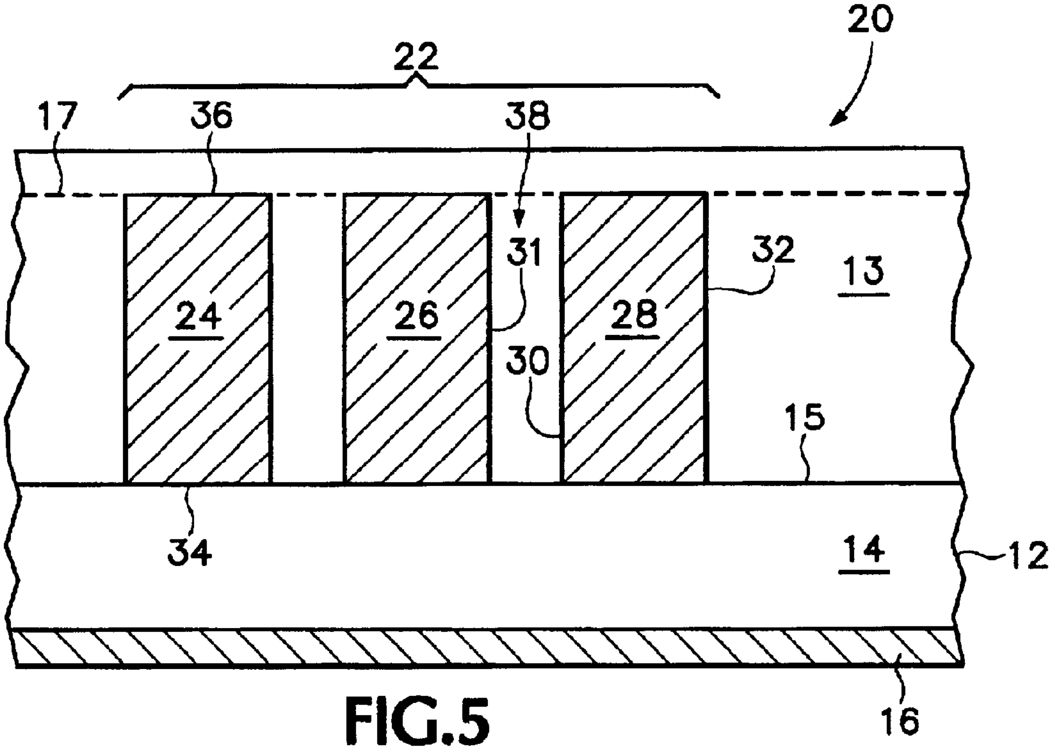
FIG. 5 is a schematic diagram representative of the transmission line circuit in accordance with an exemplary embodiment of the present invention.

In accordance with another exemplary embodiment of the present invention, referencing FIG. 5, dielectric 13 may be provided over and between the lines. In a particular exemplary embodiment, the dielectric may comprise material the same as the dielectric 14 beneath the conductive lines. Relative to Equation 6, the left term picks-up an additional multiplier $\in_r$, and the resultant relationship may be expressed by Equation 8 as follows:

$$\frac{h}{s} \geq \frac{W}{2t} \quad \text{Equation 8}$$

The h/s ration of the conductive lines, in accordance with this embodiment, may be kept at least as large as W/2t, i.e., one-half the ratio of the width W of the conductive lines relative to their thickness t of the underlying dielectric thickness. It is believed, pursuant this exemplary embodiment, that the neighboring outside conductive lines driven with the same signal may expedite propagation of the signal along the middle conductive line.

In accordance with alternative embodiments, further referencing FIG. 5, the additional dielectric 13 may comprise a surface 17 approximately level with the conductive lines. In other embodiments, although not shown, the upper surface of dielectric 13 may not be level with the height of the conductive lines.

In FIGS. 3 and 5, substrate, 12 is shown as comprising simply dielectric 14 over conductive layer (e.g., ground plane) 16. Alternatively, substrate 12 may comprise A further supporting layers, or other portions of semiconductor structures. Such other portions are not shown herein for purposes of simplifying the present disclosure. It is understood, however, that the scope of the present invention encompasses such alternative substrates.

Additionally, the dielectric 14 and ground plane 16 of FIGS. 3 and 5 are shown in simplified fashion as comprising planar level structures. In alternative embodiments of the present invention, the conductive lines may traverse a non-planar (not shown) surface. For example, the substrate may be formed with a groove, wherein the lines may traverse the groove contour. Alternatively, the conductive lines may be supported with edges coupled to a surface of a dielectric sidewall (not shown) that defines at least in part a groove within the substrate.

In accordance with further exemplary embodiments, referencing FIG. 4, the plurality of conductive lines 24,26,28 of the transmission line structure 20 may be configured to receive a common signal. As shown in FIG. 4, again, the plurality of conductive lines 24,26,28 may be represented schematically as distributed resistors 48, inter-coupling capacitors 52 and shunt capacitors 50. In this embodiment, at an input side 43 of each of the conductive lines, drivers 42 drive respective source terminals of the lines of the plurality. Line driver 42A is coupled to the input node 43A of the center conductive line 26, while line drivers 42B, 42C are coupled to input nodes 43B, 43C of the outer conductive lines 24,28 respectively. The drivers, may present the same source impedance to each of the conductive lines. The driver inputs receive a common signal from signal node 46.

In accordance with an exemplary embodiment, driver outputs may meet the conductive lines at positions 43 proximate one another. In other words, the drivers 42B, 42C meet input terminals 43B, 43C of the conductive line at substantially the same positions over the substrate as that by which line driver 42A meets input terminal 43A of conductive line 26.

Further referencing FIG. 4, the drivers 42 receive data signals from data buffer 44. Data buffer may receive a data signal from, e.g., one of a processor, memory device, keyboard, terminal, router, bus controller or other device. To keep within the pitch of the conductive lines, the line drivers 42 may be kept separate, allowing for smaller geometry designs of lower drive requirements. Additionally, any return reflections of a particular line may be kept isolated (via the separate drivers) from the common signal node 46, and likewise isolated from the center conductive line 26. Further, external noise may be shielded form the center conductor 26 by outer conductive lines 24,28.

On the output side, the center conductor 26 may be coupled to forward the propagated signal to the output destination. For example, as shown in FIG. 4, the center conductor 26 may be coupled to data receiver 56 at an output terminal. Data receive 56 may receive and buffer the propagated signal for other uses. Dummy loads 61,62 may be coupled to the output terminals 54B, 54C to terminate signals propagated thereby. In this embodiment, the dummy loads may meet the respective outer conductive lines 24,28 at positions proximate the coupling position of data receiver 56 relative to the center conductive line 26. As shown in FIG. 4, the dummy loads comprise receivers similar to data receiver 56, which is coupled to center conductive line 26. Alternatively, the dummy loads may comprise simple resistors shorted to ground. Further, data receiver 56 and dummy loads 61,62 may present similar matching impedances to the output terminals of their respective lines.

Figure 6:
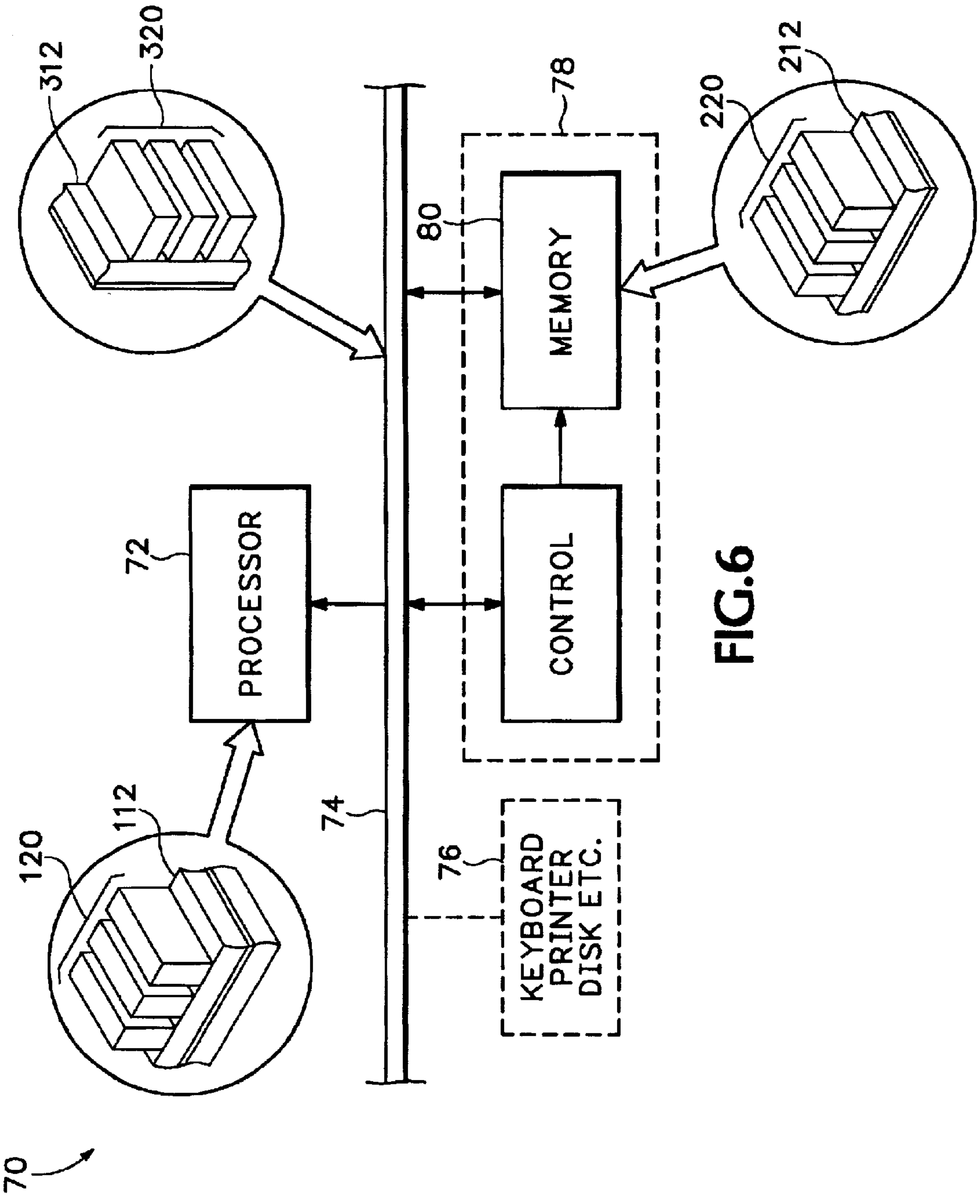
FIG. 6 is a simplified block diagram representative of exemplary embodiments of the present invention showing a computer system with transmission line structures for at least one of the processor, bus or an associated integrated circuit.

Referencing FIG. 6, in accordance with another exemplary embodiment of the present invention, a processor system 70 comprises processor 72 coupled to bus 74. Bus 74 is coupled to a plurality of sub-systems of the processor system 70, including, e.g., a keyboard, mouse, microphone, monitor, sampler interface, network interface card, printer, disk storage and/or the like 76. Additionally, bus 74 interfaces memory module 78. Memory module 78 comprises memory 80 operable under the control of a controller.

In accordance with a more particular exemplary embodiment, processor 72 comprises a transmission line structure 120 of an exemplary embodiment previously disclosed herein relative to FIGS. 3–5 over a substrate 112. In accordance with a further exemplary embodiment, memory device 80, e.g., of a semiconductor integrated circuit, likewise comprises a transmission line structure 220 as associated with an exemplary embodiment previously disclosed herein relative to FIGS. 3–5 over an insulating layer of substrate 212. In yet a further exemplary embodiment, bus 74 of the computer system might also employ a transmission line structure 320 over a substrate 312 per an exemplary embodiment disclosed previously herein relative to FIGS. 3–5.

It will be apparent to those skilled in this art that the illustrated embodiments are exemplary and that various changes and modifications may be made thereto as become apparent upon reading the present disclosure. Accordingly, such changes and modifications are considered to fall within the scope of the appended claims.

What is claimed is:

1. An apparatus comprising:

dielectric;

conductive material on the dielectric, the conductive material defining a plurality of spaced lines each line having a proximal end and a distal end;

a plurality of drivers, each driving the proximal end of a respective one of the spaced lines, each driver receiving a common input signal; and a ground plane in contact with the dielectric on a side thereof opposite the spaced lines;

wherein the h:s ratio associated with the height of the conductive lines relative to their spacing therebetween is greater than the w:t ratio associated with the width of the center conductive line relative to a thickness of the dielectric.

2. The apparatus according to claim 1, in which the h:s ratio is at least 1.5 times greater than the w:t ratio.

3. The apparatus according to claim 2, in which the h:s ratio is at least greater than the w:t ratio multiplied by the relative dielectric constant of the dielectric.

4. An apparatus comprising:

dielectric;

conductive material on the dielectric, the conductive material defining a plurality of spaced lines each line having a proximal end d a distal end;

a plurality of drivers, each driving the proximal end of a respective one of the spaced lines, each driver receiving a common input signal; and second dielectric over and between the lines;

wherein the second dielectric comprises a dielectric constant the same as that of the dielectric beneath the conductive material.

5. The transission line structure comprising:

a ground plane;

a dielectric over the sound plane;

a plurality of conductive lines over the dielectric, each conductive line comprising:

opposite primary faces, and opposite secondary faces defining their height, one of the secondary faces in contact with the dielectric to support the conductive line relative thereto; primary faces of adjacent conductive lines defining a gap therebetween, the gap distance less than the height of the conductive lines; and plurality of amplifiers to drive respective conductive lines of the plurality of conductive lines, in which the amplifiers of the plurality comprise inputs electrically coupled in common to a signal node;

wherein the dielectric comprises a thickness t, and one of the conductive lines comprises a width W between its primary faces; the ratio h:s for the height h of the conductive lines relative to the gap distance s being greater than the ratio W:t for the width W of the conductive line relative to the dielectric thickness t.

6. The transmission line structure according to claim 5, in which the h:s ratio is at least ½ times greater than the W:t ratio.

7. The apparatus comprising;

dielectric;

conductive material on the dielectric, the conductive material defining three spaced lines each line having a proximal end and a distal end;

a plurality of drivers, each driving the proximal end of a respective one of the spaced lines, each driver receiving a common input signal; and second dielectric over and between the lines;

wherein the dielectric comprises a thickness t, and the center one of the three conductive lines comprises a width W between its primary faces; the ratio h:s for the height h of the conductive lines relative to the gap distance s being greater than 1.5 times the ratio Wt. for the width W of the center conductive line relative to the dielectric thickness t.

8. An integrated circuit comprising:

a dielectric having a surface;

a plurality of conductive lines against the dielectric for signal propagation, each conductive line having a source end to receive a signal and comprising:

a first edge against the surface of the dielectric;

opposing sidewalls extending away from the dielectric, and a second edge opposite the first edge to define a height; and a plurality of amplifiers, each associated with at least one of the conductive lines and driving the source end of the at least one of the conductive lines, each amplifier having an input coupled to a signal node common to each amplifier.

9. The integrated circuit according to claim 8, in which the height is at least 1.5 times greater than the spacing between the adjacent conductive lines.

10. The integrated circuit according to claim 9, in which the plurality of conductive lines comprises three, the middle conductive line disposed between two outer conductive lines and comprising a width defined by its opposing sidewalls.

11. The integrated circuit according to claim 10, further comprising a receiver connected to the other end of the middle conductive line.

12. The integrated circuit according to claim 11, further comprising two dummy loads connected respectively to the other ends of the two outer conductive lines.

13. The integrated circuit according to claim 12, the dummy loads presenting matched impedances to their respective conductive lines.

14. The integrated circuit according to claim 8, further comprising a conductive layer against the dielectric opposite the plurality of conductive lines.

15. A computer system having a processor comprising:

a substrate with an insulating layer; and a plurality of conductive lines in contact with the insulating layer, a center conductive line disposed between two other conductive lines of the plurality to define a gap distance therebetween; and a data buffer to source a data signal to the plurality of conductive lines.

16. The computer system according to claim 15, the processor further comprising a ground plane in contact with the insulating layer on a side opposite the plurality of conductive lines.

17. The computer system according to claim 16, in which the center conductive line comprises a width W; the insulating layer comprises a thickness t; the h:s ratio for the height h of the conductive lines relative to the gap distance s being greater than the W:t ratio for the width W of the center conductive line relative to the thickness t of the insulating layer.

18. The computer system according to claim 17, in which the h:s ratio is 1.5 times greater than the W:t ratio.

19. The computer system according to claim 15, the processor further comprising a data receiver to receive a data signal from the plurality of conductive lines at a location remote the data buffer.

20. The computer system according to claim 19, in which the data receiver is coupled to receive a data signal from the center conductor of the plurality.

21. The computer system according to claim 20, the processor further comprising dunmy loads coupled to the outer conductive lines.

22. The computer system according to claim 21, in which the dummy loads are coupled to the outer conductive lines at locations thereof proximate the coupling of the data receiver to the center conductive line.

23. The computer system according to claim 22, the processor further comprising separate drivers for each of the plurality of conductive lines, each driver to receive the data signal from the data buffer and to drive its respective conductive line of the plurality.

24. The computer system according to claim 15, the processor further comprising dielectric over the conductive lines and the insulating layer.

25. The computer system according to claim 24, in which the dielectric is over and between the conductive lines.

26. The computer system according to claim 25, in which the dielectric comprises a material of dielectric constant substantially the same as the insulating layer.

* * * * *

UNITED STATES PATENT AND TRADEMARK OFFICE

CERTIFICATE OF CORRECTION

PATENT NO. : 6,781,217 B2 
DATED : August 24, 2004
INVENTOR(S) : Chow

It is certified that error appears in the above-identified patent and that said Letters Patent is hereby corrected as shown below:

<u>Column 6,</u>
Line 5, "end d a distal" should read -- end and a distal --.
Line 13, "The transmission" should read -- A transmission --.
Line 15, "the sound plane;" should read -- the ground plane; --.
Line 25, "and plurality" should read -- and a plurality --.
Line 52, "ratio Wt. for" should read -- ratioW:t for --.

<u>Column 7,</u>
Line 11, "claim 11, further" should read -- claim 11 further --.

<u>Column 8,</u>
Line 15, "comprising dunmy loads" should read -- comprising dummy loads --.

Signed and Sealed this

Eighteenth Day of January, 2005

JON W. DUDAS
*Director of the United States Patent and Trademark Office*